United States Patent [19]
Schofield et al.

[11] Patent Number: 4,965,740
[45] Date of Patent: Oct. 23, 1990

[54] APPARATUS AND METHOD FOR SELECTING AND POSITIONING TRUSS CONNECTOR PLATES

[75] Inventors: Paul J. Schofield, Thatcham, England; Leo A. Goheen, Bedford, Tex.

[73] Assignee: Truswall Systems Corporation, Arlington, Tex.

[21] Appl. No.: 292,419

[22] Filed: Dec. 30, 1988

[51] Int. Cl.$^5$ .............................................. H04N 7/18
[52] U.S. Cl. .................................... 364/512; 364/508; 340/665; 340/668; 403/27; 73/760; 73/786
[58] Field of Search ............... 364/506, 508, 512, 550; 340/665, 666, 668; 403/27; 73/786, 787, 760, 763

[56] References Cited

U.S. PATENT DOCUMENTS

| | | | |
|---|---|---|---|
| 4,366,874 | 1/1983 | Pidoux et al. | 364/508 |
| 4,433,581 | 2/1984 | Scott et al. | 364/508 |
| 4,550,376 | 10/1985 | Maciejczak | 364/512 |
| 4,757,461 | 7/1988 | Stöhr et al. | 364/512 |
| 4,789,947 | 12/1988 | Maciejczak | 364/512 |

*Primary Examiner*—Parshotam S. Lall
*Assistant Examiner*—Brian M. Mattson
*Attorney, Agent, or Firm*—W. Kirk McCord

[57] ABSTRACT

Connector plates are positioned at selected truss joints by representing each wood member of the truss as a corresponding two-dimensional polygon. Each side of the polygon is defined by a corresponding member vector having starting and ending points relative to a predetermined reference point. A particular member vector is selected as a boundary vector for each joint boundary, beyond which the connector plate cannot extend. The connector plate is represented as a rectangle of predetermined dimensions corresponding to the actual plate dimensions. Each side of the rectangle is defined by a corresponding plate vector having starting and ending points relative to the reference point. The rectangle is moved within the prescribed joint boundaries by eliminating the points of intersection between the boundary vectors and the plate vectors. The vectors are used to determine truss joint parameters, such as area of overlap of the connector plate on each of the truss members, shear, tension and combined shear-tension stresses, and eccentricity forces acting on the truss members.

17 Claims, 10 Drawing Sheets

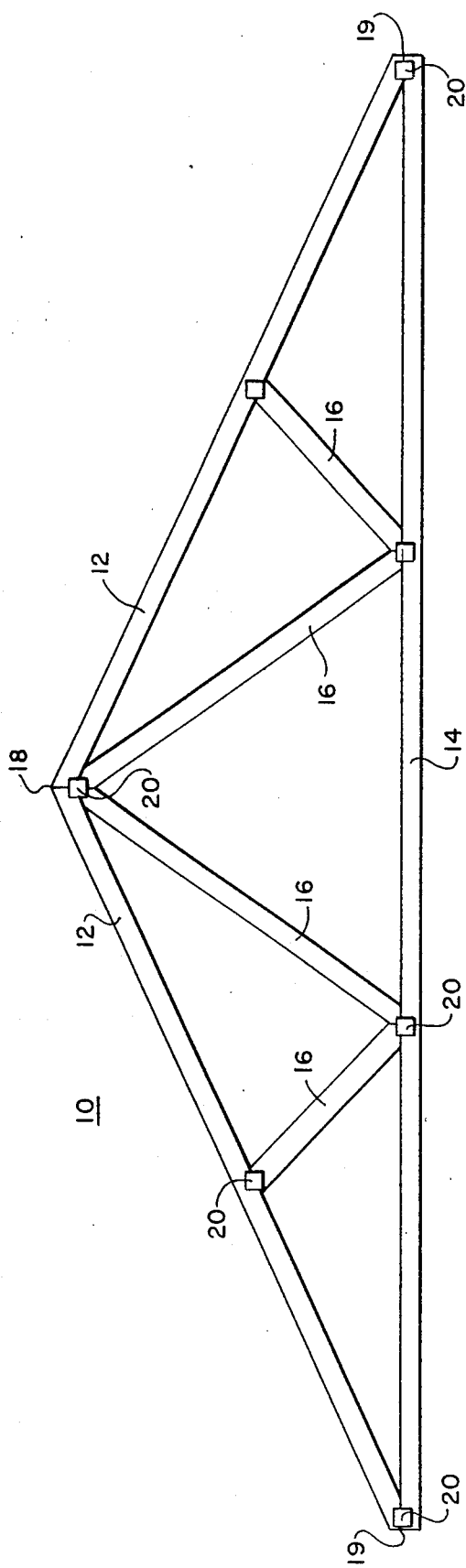
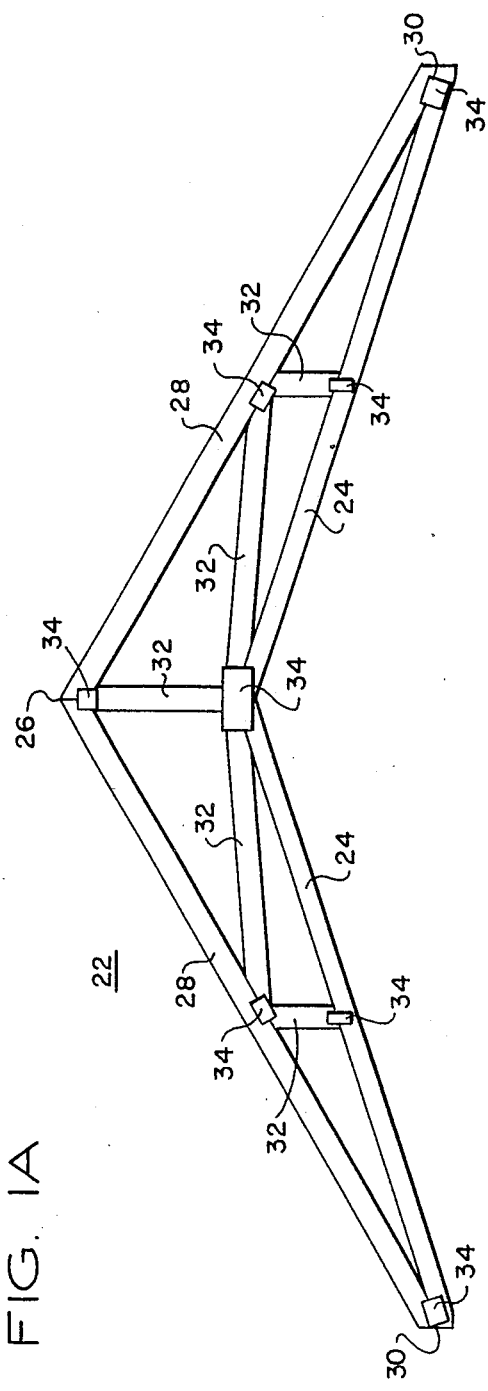
FIG. 1A
FIG. 1B

APPARATUS AND METHOD FOR SELECTING AND POSITIONING TRUSS CONNECTOR PLATES

FIELD OF THE INVENTION

The present invention relates to wood trusses used in building construction, and in particular, to an apparatus and method for selecting and positioning metal connector plates at the respective joints of the wood truss.

BACKGROUND OF THE INVENTION

A conventional truss is typically comprised of top and bottom chords, a plurality of web members extending between the top and bottom chords and a plurality of metal toothed connector plates for securing the ends of each web member to the top and bottom chords, thereby completing the fabrication of the truss. It is critical that these metal connector plates be properly positioned and attached at the joints between the web members and chords in order to provide the necessary structural strength and integrity.

DESCRIPTION OF THE PRIOR ART

According to prior practice, computer software programs are often used to assist the truss designer in the selection and placement of the connector plates. Once the truss is engineered to determine the size and shape thereof, each joint is analyzed to determine the proper size connector plate to be used and the proper position of the connector plate on the joint. Using an iterative process, different sized connector plates can be tested to find a proper connector plate for each truss joint based upon selected parameters applicable to that joint. The plate is positioned within the outermost boundaries of the truss and selected parameters, such as the area overlap of the plate on the joint members and shear and tension stresses on the joint members, are tested to determine whether the particular connector plate is suitable for that joint.

The position of the connector plate on the joint is determined by first placing the geometric center of the plate coincident with the predetermined geometric center of the joint and checking the point coordinates (based upon a reference Cartesian coordinate system) of each of the four corners of the rectangular plate to determine whether any of the four corners of the plate is outside of the outer boundary of the joint. The plate is then moved accordingly to position the plate within the outer boundary of the joint.

One problem associated with this prior art technique is that only the outer boundaries of the truss are considered and not the inner boundaries thereof. For example, in the case of trusses used in building attics, the connector plates may not be able to extend beyond the inner boundaries of the truss. Another problem with prior art placement techniques is that "non-standard" joints are often modeled by "standard" joints, which are based upon an estimation of the shape of the joint and not upon the actual shape thereof. For example, the estimated shape of the joint may be based upon an assumed number of cuts in the joint members, but the actual shape of the joint may involve a different number of cuts, and hence, a different shape from that estimated, thereby leading to errors in the placement of the plates.

It is also difficult using prior art techniques to accurately determine the area of overlap of the plate on the joint not only because the shape of the joint members is not always well-defined, but also because it is difficult to determine the positions of the corners of the rectangular plate after the plate is superimposed on the joint members. The aforementioned estimations can also lead to significant errors in other joint parameters.

OBJECTS OF THE INVENTION

It is, therefore, the principal object of the present invention to provide an improved apparatus and method for selecting and positioning metal connector plates in a wood truss.

Another object of the invention is to provide a universal method for positioning the connector plates on the truss joints, irrespective of the actual shape of the joints.

Still another object of the invention is to provide an apparatus and method for enhancing the accuracy with which the connector plates are positioned on the respective truss joints.

A further object of the invention is to provide an apparatus and method by which the metal connector plates can be positioned within both the inner and outer boundaries of the truss.

Yet another object of the invention is to provide an apparatus and method by which the area of overlap of the connector plates on a truss joint can be accurately determined for truss joints of various shapes and sizes.

SUMMARY OF THE INVENTION

These and other objects are accomplished in accordance with the present invention wherein an apparatus and method for selecting and positioning truss connector plates is provided. In one aspect of the invention, the connector plate is positioned at a corresponding joint between a plurality of wood members of a wood truss by the following steps: (1) establishing a Cartesian coordinate system, the origin of which corresponds to a predetermined reference point on the joint; (2) representing each wood member as a corresponding two dimensional polygon, each side of which is defined by a corresponding member vector; (3) selecting a particular member vector as a boundary vector for each joint boundary beyond which the connector plate cannot extend; (4) representing the connector plate as a rectangle of predetermined dimensions corresponding to the actual dimensions of the plate; (5) initially positioning the rectangle so that the geometric center thereof coincides with the reference point; and (6) determining whether any of the plate vectors intersects a boundary vector, and, if so, repositioning the rectangle to move it within the boundary vector. Each of the member vectors has starting and ending points expressed in Cartesian coordinates relative to the reference point to define a predetermined direction around the perimeter of the corresponding polygon. Similarly, each of the plate vectors has starting and ending points expressed in Cartesian coordinates relative to the reference point to define a predetermined direction around the perimeter of the rectangle.

In the preferred embodiment, the respective directions of the member vectors define a counterclockwise rotation around the corresponding polygon and the respective directions of the plate vectors define a counterclockwise rotation around the rectangle. The step of determining whether any of the plate vectors intersects a boundary vector and, if so, repositioning the rectangle is comprised of the following sub-steps for each boundary vector: (1) selecting a particular boundary vector and determining which, if any, of the plate vectors intersects the particular boundary vector; (2) if any of the plate vectors intersects the particular boundary vector, selecting a particular plate vector which intersects the particular boundary vector and determining the Cartesian coordinates of the point of intersection of the particular plate vector with the particular boundary vector and the Cartesian coordinates of a distal point on the particular plate vector which extends the farthest beyond the particular boundary vector; (3) moving the rectangle a first predetermined distance equal to the difference between respective first coordinates of the intersection point and the distal point along a corresponding first axis of the coordinate system and a second predetermined distance equal to the difference between respective second coordinates of the intersection point and the distal point along a corresponding second axis of the coordinate system, which is perpendicular to the first axis, so that the particular plate vector does not intersect the particular boundary vector; and (4) if necessary, repeating the aforementioned three sub-steps with respect to each plate vector which intersects the boundary vector so that the rectangle is completely within the boundary represented by the particular boundary vector. The aforementioned four sub-steps are iteratively repeated until either none of the plate vectors intersects any of the boundary vectors or until it is determined that the plate cannot be properly positioned within the predetermined joint boundary.

In another aspect of the invention, the respective areas of overlap of the connector plate on the individual wood members of the truss joint are determined by intersecting the rectangle with the respective polygons represented by the wood members. The areas of intersection represent the respective areas of overlap of the connector plate on the respective wood members. In the preferred embodiment, the following procedure is used to determine the respective areas of intersection; (1) defining each area of intersection as a corresponding intersection polygon having a determined number of corner points; (2) determining the Cartesian coordinates of each of the corner points; and (3) determining the area of the intersection polygon by solving the following equation:

$$\text{Area} = \sum_{i=1}^{n} (Yi + 1 - Yi)(Xi + 1 + Xi)/2$$

where n is the number of corner points and $Xi$, $Yi$ are the Cartesian coordinates of the ith corner point. The area of overlap of the plate determined for each wood member is compared with a predetermined minimum area of overlap for the corresponding wood member to determine whether the connector plate meets applicable criteria for the corresponding wood member.

In still another aspect of the invention, the eccentric forces acting on a truss joint at which top and bottom chords of the truss intersect and are secured together by a metal connector plate is determined in accordance with the following procedure: (1) defining a first two dimensional polygon representing the area of overlap of the connector plate on the top chord and a second two dimensional polygon representing the area of overlap of the metal connector plate on the bottom chord; (2) selecting one of the corner points on the first polygon and computing the magnitude and direction of axial and eccentric stresses acting on the first corner point; (3) summing the respective magnitudes and directions of the axial and eccentric stresses to determine the magnitude and direction of the resultant stress on the first corner point; (4) comparing the computed resultant stress with the predetermined allowable stress; and (5) if the computed resultant stress is less than the predetermined allowable stress on the first corner point, repeating each of the aforementioned four steps with respect to each of the corner points of the first polygon until it has been determined either that the computed resultant stress for each corner point for each polygon is less than the corresponding allowable stress or that the computed resultant stress for one of the corner points is determined to be greater than the corresponding allowable stress. If the resultant stress on each of the corner points of the first polygon is less than the corresponding allowable stress at each of the corner points, the aforementioned five steps are repeated with respect to the second polygon.

In accordance with the present invention, the connector plates can be positioned within both the inner and outer boundaries of the joint and joint parameters, such as area overlap and eccentricity, can be accurately determined using a standard procedure which is valid for joints of various sizes and shapes. The individual members of the joint are defined by respective two dimensional polygons. Each side of the polygon is comprised of a vector having a defined magnitude and direction. Similarly, the connector plate is modeled by a rectangle, each side of which is defined by a vector having a predetermined magnitude and direction. The respective points of intersection between the plate vectors and the vectors defining the joint members are useful in determining the position of the plate relative to each of the joint members for accurately determining the plate parameters specified above. Furthermore, by selecting certain ones of the joint member vectors as boundary vectors for the joint, the plate can be moved within any prescribed joint boundary.

BRIEF DESCRIPTION OF THE DRAWINGS

Other objects and advantages of the invention will be apparent from the detailed description and claims when read in conjunction with the accompanying drawings wherein:

FIGS. 1A and 1B are respective elevation views of first and second embodiments of a wood truss with metal connector plates attached at the respective joints of the truss;

DETAILED DESCRIPTION OF THE PREFERRED EMBODIMENT

Figure 2A:
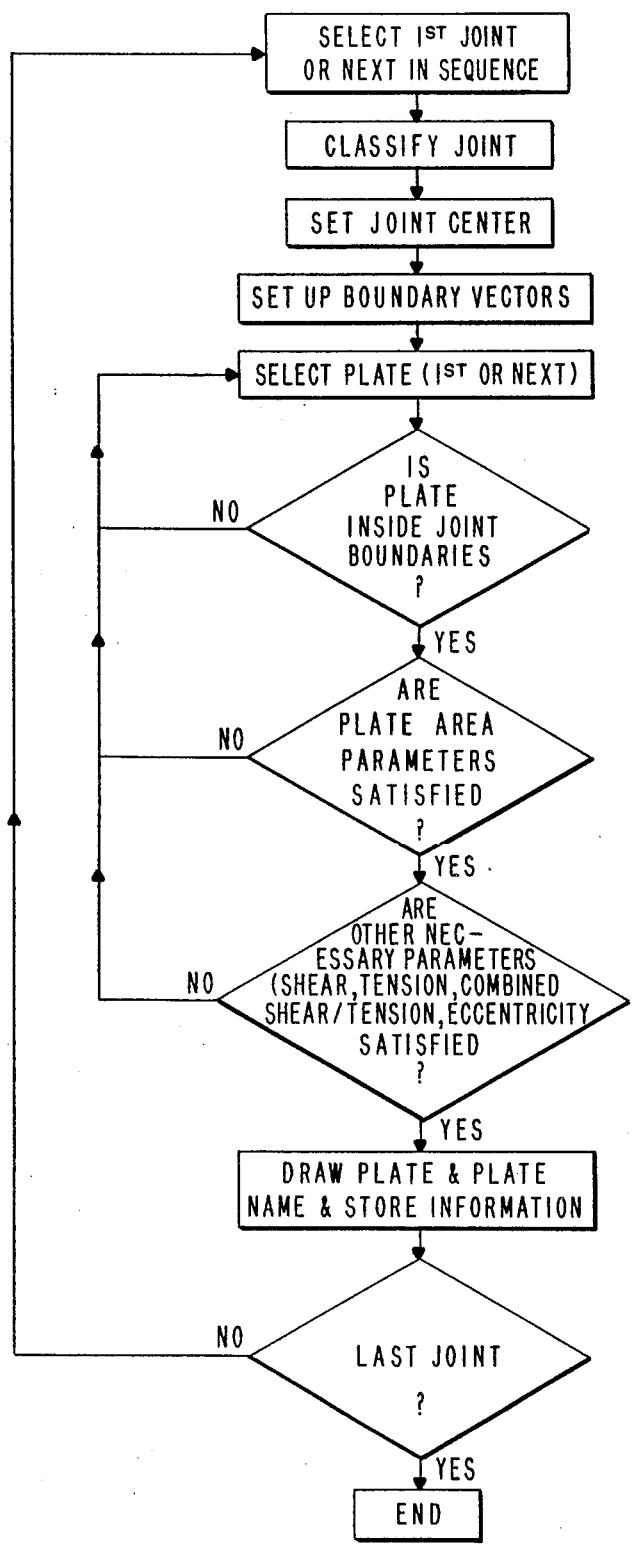
FIGS. 2A-2E are respective flow diagrams illustrating the system and method for selecting and positioning a connector plate at a corresponding truss joint in accordance with the present invention.

In the description which follows, like parts are marked throughout the specification and drawings, respectively. The drawings are not necessarily to scale, and in some instances, proportions have been exaggerated in order to more clearly depict certain features of the invention.

Referring to FIG. 1A, a conventional roof truss 10 is depicted. Truss 10 is comprised of a top chord 12, a bottom chord 14 and a plurality of web members 16 interconnecting top and bottom chords 12 and 14. Top chord 12 is comprised of two wood members, respective first ends of which intersect at an obtuse angle to define apex 18 of truss 10. The respective second ends of the two wood members, opposite from the respective first ends thereof, intersect bottom chord 14 at respective opposite sides of truss 10 to define respective heel joints 19. The intersections between web members 16 and top and bottom chords 12 and 14 also define respective joints on truss 10. Toothed metal connector plates 20 are disposed at predetermined positions on the corresponding truss joints to hold the wood members in position and provide structural integrity for truss 10.

Referring to FIG. 1B, another embodiment of a roof truss is depicted. Truss 22 is similar to truss 10 except that bottom chord 24 is also comprised of a pair of wood members, respective first ends of which intersect at an obtuse angle below apex 26 of truss 22 so that truss 22 defines a vaulted structure, such as that frequently used in attic areas. The intersection of respective first ends of the two members comprising top chord 28 defines apex 26. Respective second ends of the wood members comprising top chord 28, opposite from the respective first ends thereof, intersect corresponding second ends of the wood members comprising bottom chord 24 to define respective heel joints 30 on opposite sides of truss 22. Wooden web members 32 interconnect top and bottom chords 28 and 24. One skilled in the art will recognize that web members 32 are oriented differently from web members 16 of truss 10, but that their function is substantially the same. Toothed metal connector plates 34 are disposed at predetermined positions on the truss joints to secure the joints as previously described.

The selection of proper sized connector plates and the placement of these connector plates on the truss joints is critical to the structural strength and integrity of the truss. In accordance with the present invention, the selection and placement of the connector plates at the truss joints is preferably accomplished by a computer-based routine, as depicted in FIGS. 2A-2E. A computer system for implementing the plate selection/placement program routine is described below with reference to FIG. 10.

Referring to FIG. 2A, the overall selection/placement routine is shown. Beginning at one side of the truss (e.g., left heel joint 19 in FIG. 1A or left heel joint 30 in FIG. 1B), each joint is considered in sequence from the first numbered joint to the last. For example, the joints may be numbered in sequence beginning with the left heel joint and ending with the right heel joint. A connector plate is selected and positioned at each joint, one joint at a time, such that the program will not consider the next joint in sequence until the particular joint being considered has been properly plated. The joint under consideration is classified to determine the type of joint, such as a heel joint or an interior joint. Depending upon the classification, the geometric center of the joint is determined. In accordance with the present invention each of the wooden members comprising the joint is modeled by a two-dimensional polygon, the sides of which correspond to the perimeter of a major surface of the corresponding wooden member. Each side of the polygon is represented by a member vector having starting and ending points at respective corners of the polygon. The respective directions of the member vectors define a counterclockwise rotation around the polygon. Depending upon the classification of the joint, one or more of the member vectors are selected as boundary vectors to define the boundary or boundaries for a particular joint beyond which the connector plate cannot extend. The particular vector or vectors selected as boundary vectors depends upon the classification of the joint, as will be described in greater detail hereinafter.

Once the boundary vector or vectors are established, the program will select from an inventory of connector plates the smallest plate which could possibly meet the parameters for that particular joint. The classification of the joint being considered determines the range of acceptable connector plates. The program will then test the particular plate to determine whether it satisfies the range of parameters established for that particular joint. If the plate satisfies all of the parameters, the particular plate will be identified and stored in the system memory along with the location of the plate on the joint, and the program will move on to the next joint in sequence. If, on the other hand, the plate does not satisfy all of the parameters for that joint, the program will select the next larger plate from the inventory of available plates and repeat the process to determine whether the next larger plate satisfies all of the joint parameters. The process described above is repeated until an acceptable plate is found for that particular joint. Once this is accomplished, the program will move to the next joint in sequence and repeat the aforementioned process until all of the joints have been properly plated.

Figure 2B:
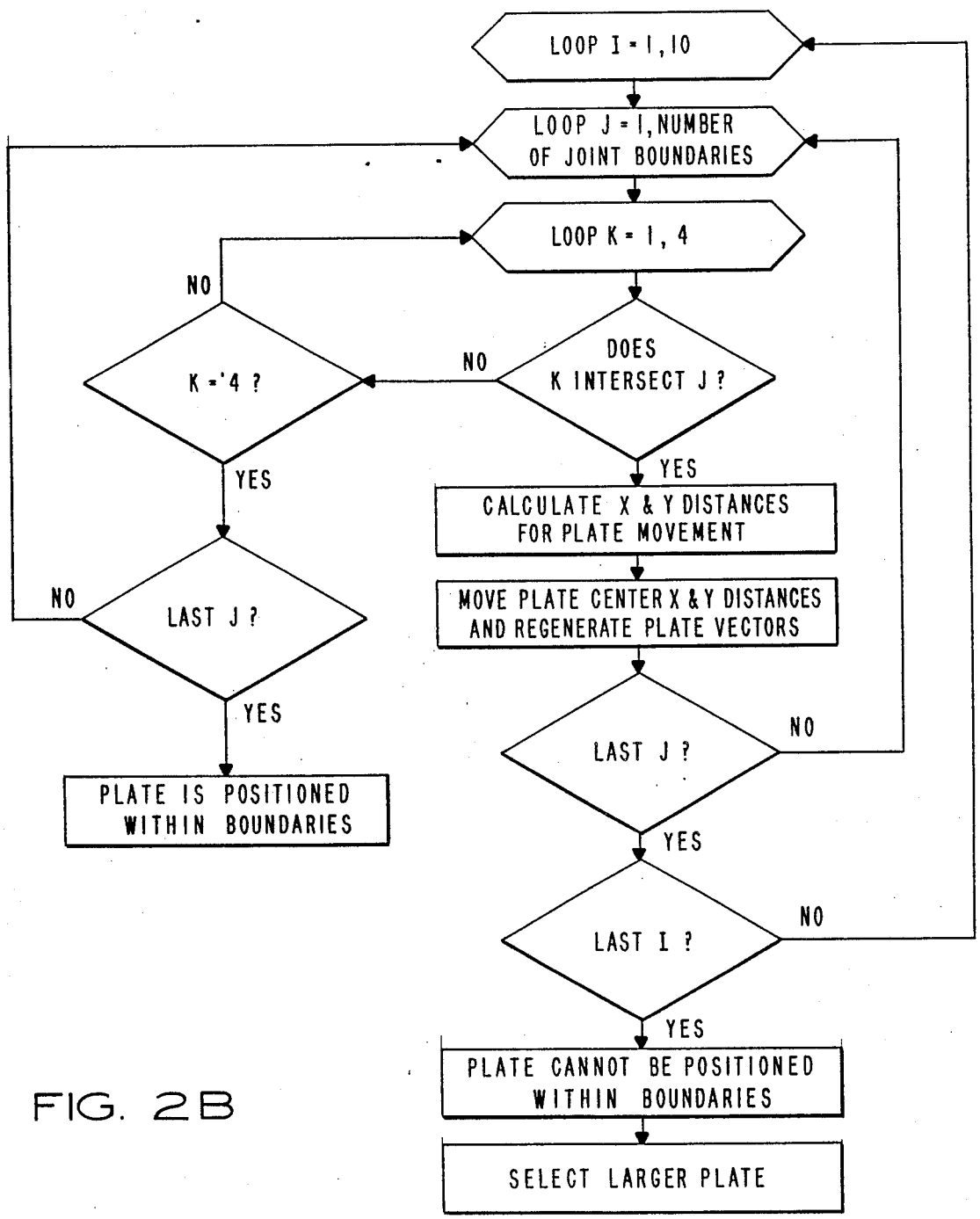

The various routines used for determining whether a particular plate satisfies the applicable parameters are depicted in greater detail in FIGS. 2B-2E. Referring to FIG. 2B, the boundary routine for positioning the connector plate within the selected joint boundary or boundaries is shown. This routine involves three program loops, designated 1, J and K. Loop K is performed within Loop J, and Loop J in turn is performed within Loop I. Loop I is limited to ten iterations so that if a particular connector plate cannot be positioned within the joint boundary or boundaries after ten iterations of Loop 1, the program will discard that plate and select the next larger plate. One skilled in the art will recognize that the number ten is arbitrarily chosen, and that any other number can be substituted to vary the number of iterations of Loop I.

Just as the wood members of the joint are represented by two dimensional polygons, the sides of which are defined by corresponding member vectors, the connector plate is also defined by a rectangle, the sides of which are comprised of corresponding plate vectors defining a counterclockwise rotation around the rectangle.

Figure 3:
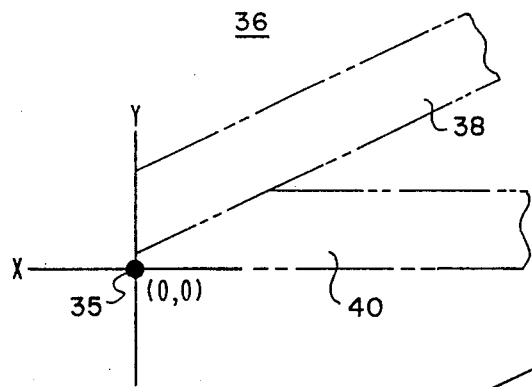
FIG. 3 is a sectional view of a heel joint of a truss, illustrating the establishment of a Cartesian coordinate system for reference purposes.
Figure 4:
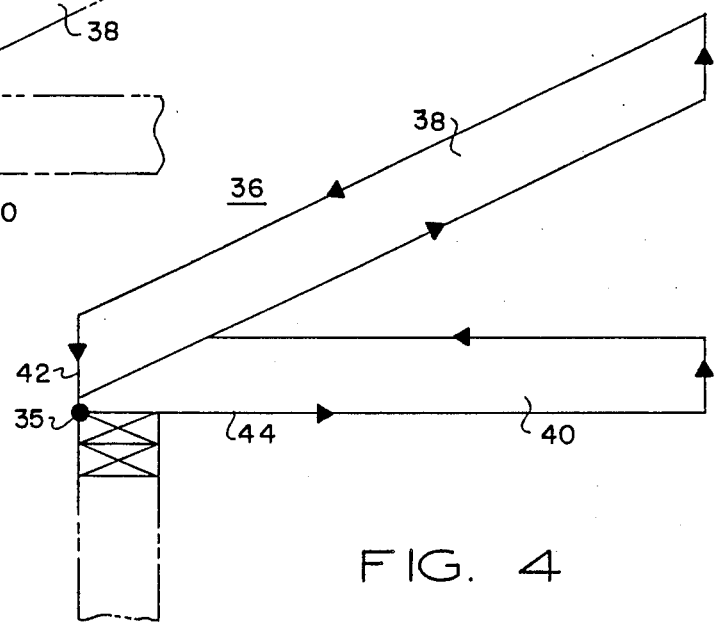
FIG. 4 is a sectional view of the heel joint illustrated in FIG. 3, which shows the individual members of the truss joint being defined by a plurality of vectors rotating in a counterclockwise direction around each of the members.

Referring also to FIGS. 3 and 4, a Cartesian coordinate system is established having a point of origin (0,0), indicated at 35, which corresponds to a predetermined reference point on the truss. In FIG. 3, the origin point is at the lower left edge of the truss, which corresponds to the center of left heel joint 36 depicted in FIG. 3. Heel joint 36 is defined by the intersection of respective ends of diagonally oriented top chord 38 and horizontal bottom chord 40. The X-axis runs horizontally along the bottom edge of bottom chord 40, and the Y-axis runs vertically along the left side of heel joint 36. As shown in FIG. 4, top and bottom chords 38 and 40 are represented by corresponding polygons, the respective perimeters of which are defined by respective member vectors. As indicated by the arrows in FIG. 5, the member vectors define a counterclockwise rotation around the corresponding polygon. The joint boundaries in this example are defined by vector 42 extending along the left side of joint 36 and vector 44 extending along the bottom edge of joint 36.

Figure 5A:
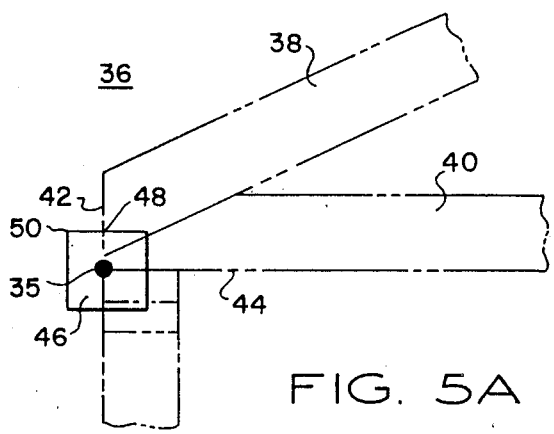
FIGS. 5A-5C are respective sectional views of the heel joint of the truss, illustrating the positioning of a truss connector plate within the prescribed joint boundaries.
Figure 5B:
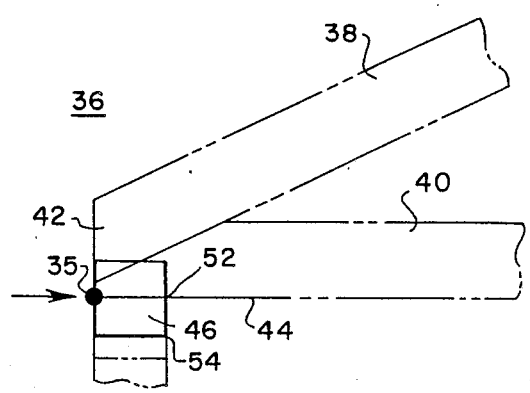
Figure 5C:
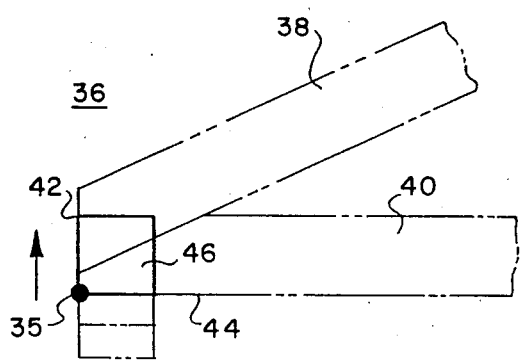

Referring to FIGS. 5A-5C, rectangle 46 representing the connector plate is initially positioned so that the geometric center thereof coincides with the center of joint 36 (in this case origin 35). A first boundary vector (J=1) is selected. In this case, the first boundary vector corresponds to the vertical boundary represented by vector 42. The program then determines whether any of the four plate vectors (K=1,4) defining the four sides of rectangle 46 intersects the first boundary vector selected (in this case vector 42). If none of the four plate vectors intersects the first boundary vector, Loop K is completed and the program will select the next boundary vector in sequence (in this case vector 44). Loop X will be repeated to determine whether any of the four plate vectors intersects the second boundary vector and so on until all of the boundary vectors have been examined. If none of the plate vectors intersects any of the boundary vectors, the plate is properly positioned within the joint boundaries and the plate positioning routine is complete. If, however, one of the plate vectors does intersect one of the boundary vectors, rectangle 46 must be moved to position it within the joint boundaries.

FIGS. 5A-5C illustrate the repositioning of rectangle 46. The initial position of rectangle 46 is such that its geometric center is coincident with origin 35. One skilled in the art will recognize that at least one plate vector intersects both boundary vectors 42 and 44. Considering first boundary 42, rectangle 46 is moved horizontally to the right, as depicted In FIG. 5B, a distance equal to the difference between the X-coordinates of point of intersection 48 of the corresponding plate vector with first boundary vector 42 and a distal point 50 on the corresponding plate vector representing the point of farthest extension beyond first boundary vector 42. After this horizontal movement is accomplished, rectangle 46 is completely within first boundary vector 42 as shown in FIG. 5B.

Second boundary vector 44 is considered next. At least one plate vector intersects second boundary vector 44. To move rectangle 46 within second boundary vector 44, rectangle 46 is moved vertically along the Y-axis, as shown in FIG. 5C, by an amount equal to the difference between the Y-coordinates of point of intersection 52 of the corresponding plate vector with second boundary vector 44 and a distal point 54 on the corresponding plate vector which is the point of farthest extension beyond second vector boundary 44. After this vertical movement is accomplished, rectangle 46 is completely within both boundary vectors 42 and 44, as shown in FIG. 5C.

Figure 6A:
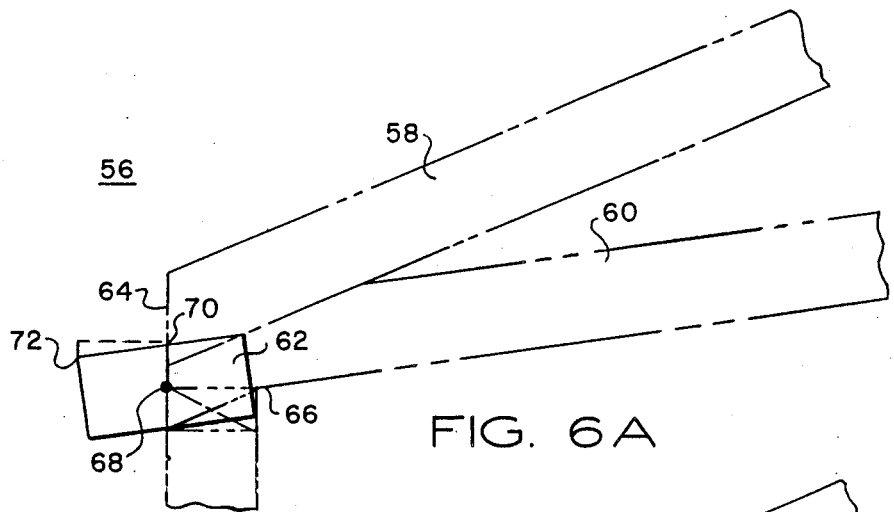
FIGS. 6A-6C are respective sectional views of the truss heel joint depicting another example of the movement of the truss connector plate within the prescribed boundaries.
Figure 6B:
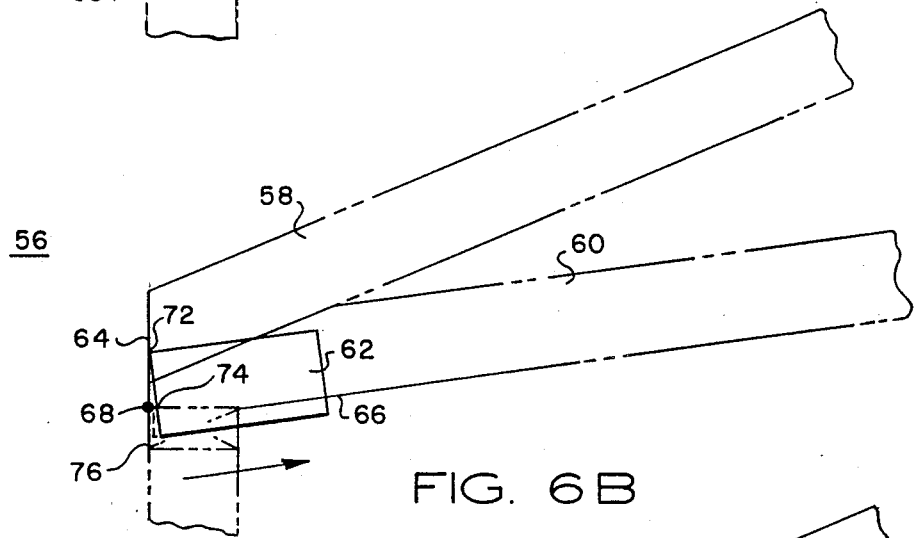
Figure 6C:
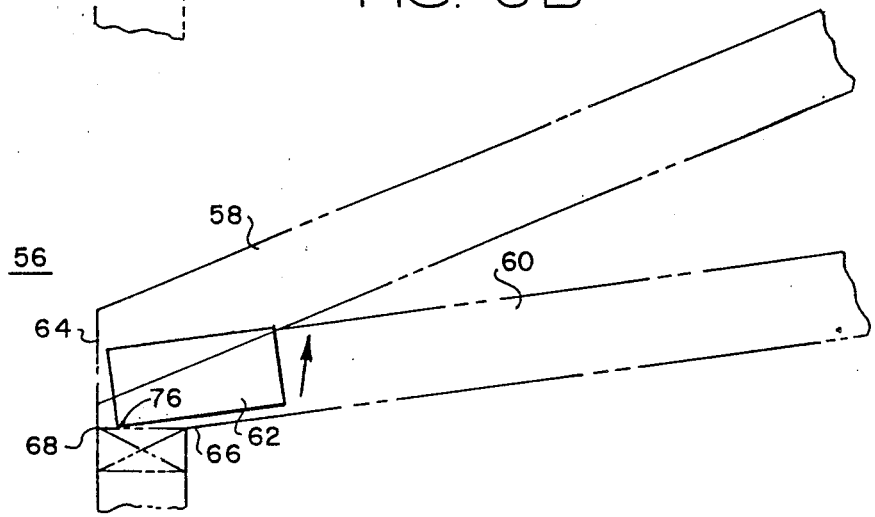

The example depicted in FIGS. 5A-5C is somewhat simplistic in that it shows movement only in the horizontal direction to move rectangle 46 within first boundary vector 42 and movement only in the vertical direction to move rectangle 46 within second boundary vector 44. In reality it may be necessary to move rectangle 46 both horizontally and vertically to move it within the corresponding joint boundaries. An example of this type of movement is depicted in FIGS. 6A-6C. FIGS. 6A-6C depict a truss heel joint 56 in which both top chord 58 and bottom chord 60 are oriented diagonally. Rectangle 62 representing the connector plate is oriented diagonally with respect to the Cartesian coordinate system. The joint boundaries are defined by first boundary vector 64 extending along the left edge of heel joint 56 and second boundary vector 66 extending along the bottom edge of bottom chord 60. One skilled in the art will recognize that both boundary vectors 64 and 66 are violated when rectangle 62 is positioned with its geometric center coincident with the center of joint 56. The joint center in this instance coincides with origin 68 of the Cartesian coordinate system.

In order to move rectangle 62 within first boundary vector 64, rectangle 62 is moved diagonally, as indicated by the arrow in FIG. 6B. This involves movement of rectangle 62 along both the X-axis and the Y-axis. The center of rectangle 62 is moved to the right along the Xaxis by an amount equal to the difference between the respective X-coordinates of point of intersection 70 between the corresponding plate vector of rectangle 62 and first boundary vector 64 and distal point 72 representing the point of farthest extension of the corresponding plate vector beyond first boundary vector 64. The center of rectangle 62 is moved upwardly along the Y-axis by an amount equal to the difference between the respective Ycoordinates of point of intersection 70 and distal point 72.

After the initial movement described above, rectangle 62 is positioned inside of first boundary vector 64, but is still outside of second boundary vector 66, as shown in FIG. 6B. To rectify this condition, the center of rectangle 62 is moved to the right along the X-axis in an amount equal to the difference between the respective X-coordinates of point of intersection 74 between the corresponding plate vector of rectangle 62 and second boundary vector 66 and a distal point 76 representing the point of farthest extension of the corresponding plate vector beyond second boundary vector 66. Similarly, the center of rectangle 62 is moved upwardly along the Y-axis by an amount equal to the difference between the respective Y-coordinates of point of intersection 74 and distal point 76 so that rectangle 62 is moved in the direction indicated by the arrow in FIG. 6C. After these movements, rectangle 62 is positioned within both joint boundaries as shown in FIG. 6C.

Referring again to FIG. 2B, the process described above is repeated until none of the plate vectors intersects any of the boundary vectors or until Loop I is completed ten times, whichever occurs first. Loop K is run one time for each joint boundary so that Loop K is run a number of times equal to the number of boundaries for that particular joint. Loop J is run one time for each iteration of Loop 1. One skilled in the art will appreciate that the positioning routine described above will be repeated until a complete routine is run in which none of the plate vectors intersects any boundary vector or until Loop I is run the prescribed number of times (in this case ten times), whichever occurs first. This repetition is required because movements of the plate to position it within a particular boundary may cause the plate to be moved outside of a boundary previously considered. Therefore, all of the boundaries must be continually checked until it is determined that no plate movements are required in order to satisfy the boundary conditions. If this condition does not occur before Loop I is run the prescribed number of times, the program will discard the plate and select the next larger plate from the available plate inventory.

Figure 2C:
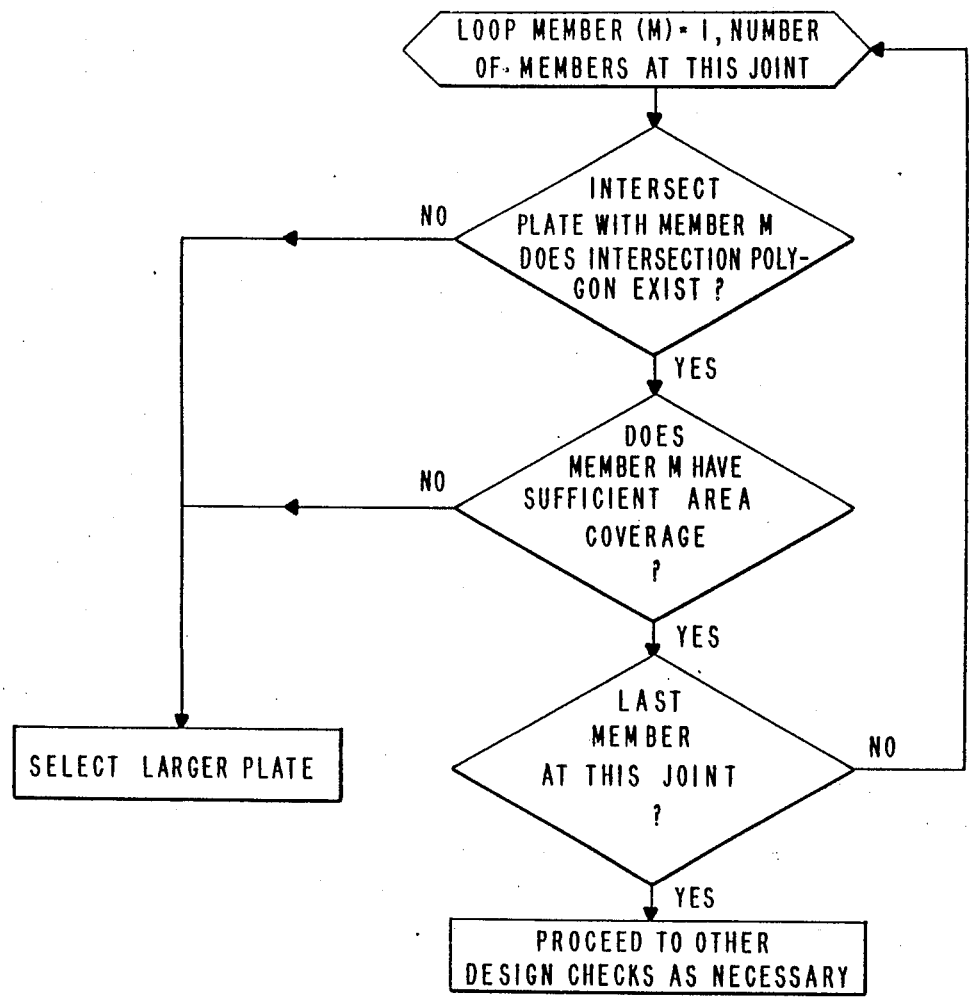
Figure 7A:
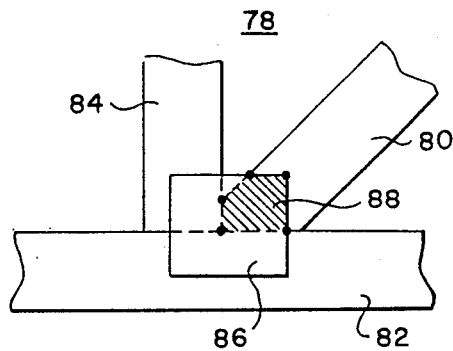
FIGS. 7A and 7B are respective sectional views of an interior truss joint, illustrating the determination of the area of overlap of the connector plate on one of the members of the joint.
Figure 7B:
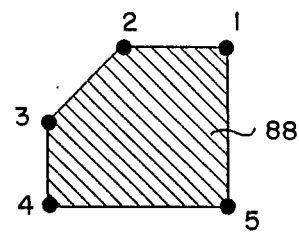

Referring to FIGS. 2C, 7A and 7b, another aspect of the invention is illustrated in which the area of overlap of a connector plate on each of the wood members of a particular truss joint is determined and compared with the minimum area overlap acceptable for that joint. The plate area overlap parameters are not considered until the plate satisfies the boundary conditions, as previously described with respect to FIG. 2B. Each of the wood members of the joint is assigned a sequential number and the routine begins with the first wood member. The perimeter of a major surface of each wood member is defined by corresponding member vectors and the plate perimeter is defined by corresponding plate vectors, as described previously. Once the plate is properly positioned on the joint, the program determines whether the rectangle representing the connector plate intersects the polygon representing the first wood member of the joint. If no intersection exists, there is no area of overlap between the connector plate and the particular wood member, which necessitates the selection of a larger plate. If an intersection exists, the program determines the location of the area of intersection between the rectangle and the first wood member by determining the coordinates of the points of intersection between the plate vectors and the corresponding member vectors. The area of intersection is defined by a polygon, which represents the area overlap of the connector plate on the first wood member.

For example, in FIGS. 7A and 7B as interior truss joint 78 is depicted in which a first web member 80 intersects bottom chord 82 diagonally and a second web member 84 intersects bottom chord 82 substantially at right angles. The overlap of rectangle 86 on first web member 80 defines a substantially trapezoidal shaped polygon 88 with five sides and five corner points 1,2,3,4 and 5. The area of polygon 88 determines the area overlap parameter.

The area of polygon 88 is arrived at by solving the following equation known as Green's Theorem for the area of a polygon given an ordered set of X and Y coordinates:

$$A = \sum_{i=1}^{n} (Y_{i+1} - Y_i)(X_{i+1} + X_i)/2$$

where A is the area of polygon 88, n is the number of corner points of polygon 88 (in this example, n=5) and Xi, Yi are the Cartesian coordinates of the ith corner point of polygon 88. The equation involves multiplying the difference between the Y-coordinates of each pair of adjacent corner points by the sum of the X-coordinates of each pair of adjacent corner points, dividing the product by 2, and then summing the results for all n pairs of corner points. In the example illustrated by FIGS. 7A and 7B, corner point 1 will also be corner point 6 so that the calculations using Green's Theorem will proceed counterclockwise around polygon 88, beginning with corner points 1 and 2 and ending with corner points 5 and 6 (same as 1).

The computed area of polygon 88 is compared with the predetermined parameter representing the minimum area overlap which is acceptable for that particular wood member of the joint. If the computed area overlap exceeds the minimum acceptable area overlap, then first web member 80 is determined to have sufficient area coverage by that particular connector plate represented by rectangle 86 and the next parameter will be checked. If the area overlap falls short of the minimum acceptable area overlap, a larger plate is selected and the process will begin anew with respect to the new plate.

Figure 2D:
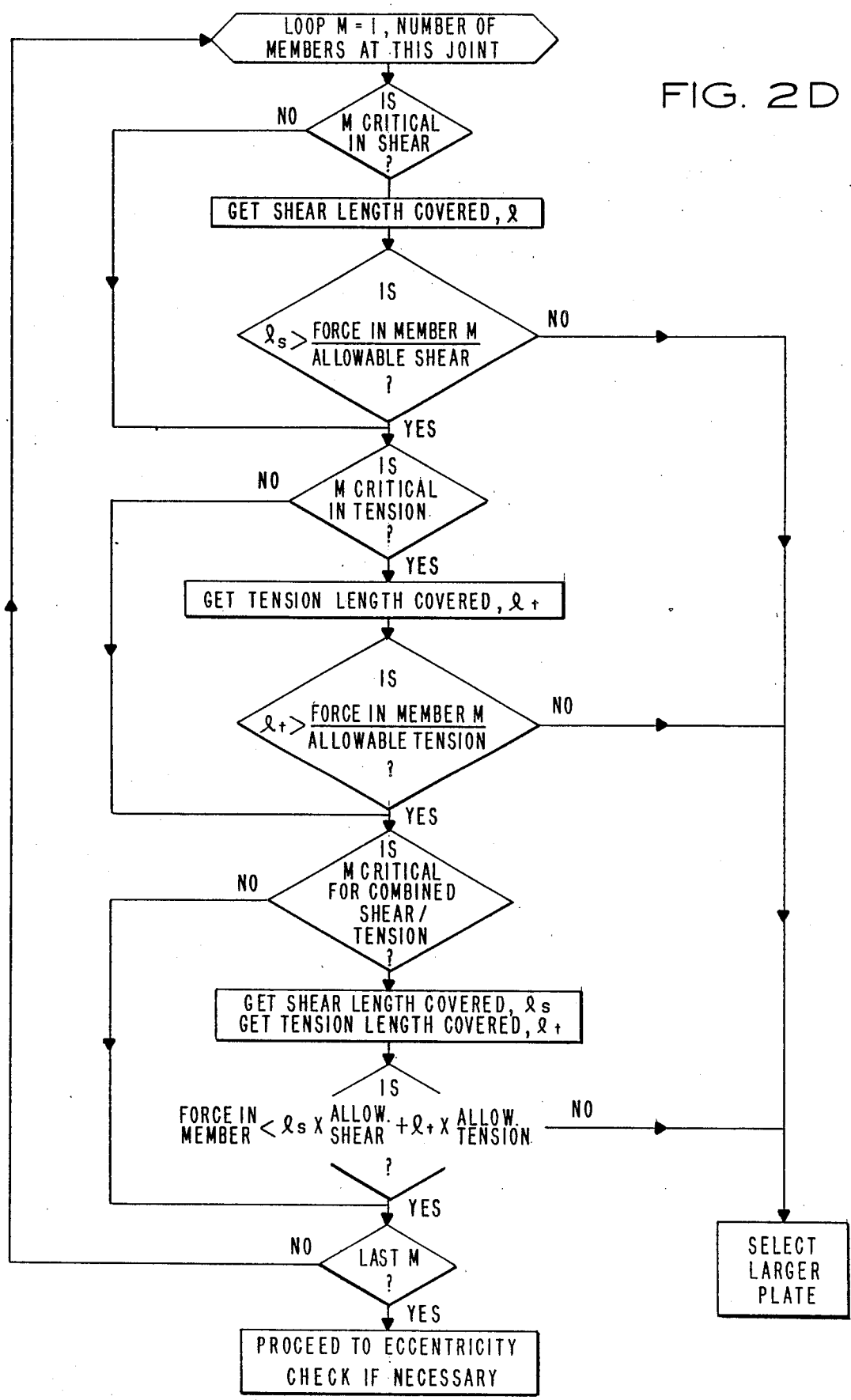
Figure 8:
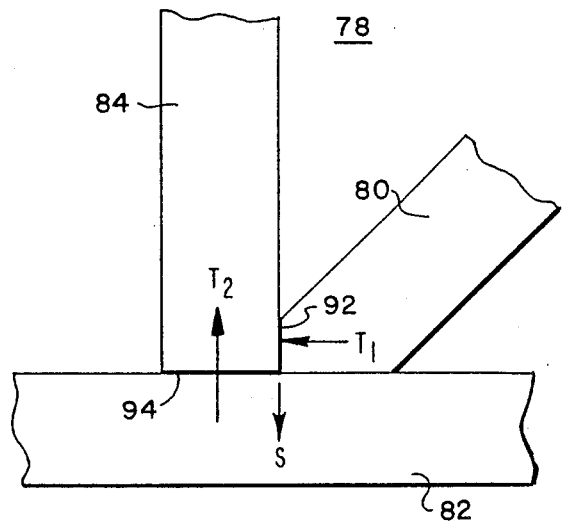
FIG. 8 is a sectional view of an interior truss joint, illustrating the shear and tension stresses acting on the truss joint.

Referring to FIGS. 2D and 8, if the chosen connector plate satisfies the boundary parameters and the area overlap parameters, certain other parameters, such as shear, tension and combined shear-tension forces, may have to be checked for certain critical members. Shear forces are those forces which act parallel to the interface between joint members, while tension forces act perpendicular to the interface. Certain members may be critical with respect to shear, others with respect to tension and still others with respect to both shear and tension. The maximum allowable shear and tension forces are determined by empirical testing based on the thickness of the particular wood members and the type of plate being used. FIG. 8 illustrates shear force S and tension Force T1 on interface 92 between first and second web members 80 and 84 which result from force F acting in first web member 80. The shear length 1s along interface 92 which is covered by the connector plate is determined and is compared with a ratio, the numerator of which is shear force S and the denominator of which is the maximum allowable shear, expressed in terms of force per unit length. If 1s is greater than the aforementioned ratio, the shear parameter is satisfied. Similarly, the tension length 1t along interface 92 which is covered by the connector plate is determined and is compared with a ratio, the numerator of which is the tension force T1 and the denominator of which is the maximum allowable tension, expressed in terms of force per unit length. If 1t is greater than this ratio, the tension parameter is satisfied.

It is often the case that a combination of shear and tension forces act on a particular interface, such as interface 92 in FIG. 8. In that event a combined shear-tension check may be required. In order to satisfy the shear-tension parameter, force F acting in first web member 80 must be less than the product of shear length covered by the plate, 1s, and the maximum allowable shear plus the product of tension length, 1t, covered by the plate and the maximum allowable tension. If the particular member under consideration (e.g., web member 80) meets the applicable criteria for shear tension and combined shear-tension, the process will continue for the next member in sequence (e.g., web member 84). As depicted in FIG. 2D on FIG. 9 only a tension force T2 is shown as acting on interface 94 between web member 84 and bottom chord 82. Thus, if web member 84 is not critical as to shear, only the tension check will be performed, as described above.

Figure 2E:
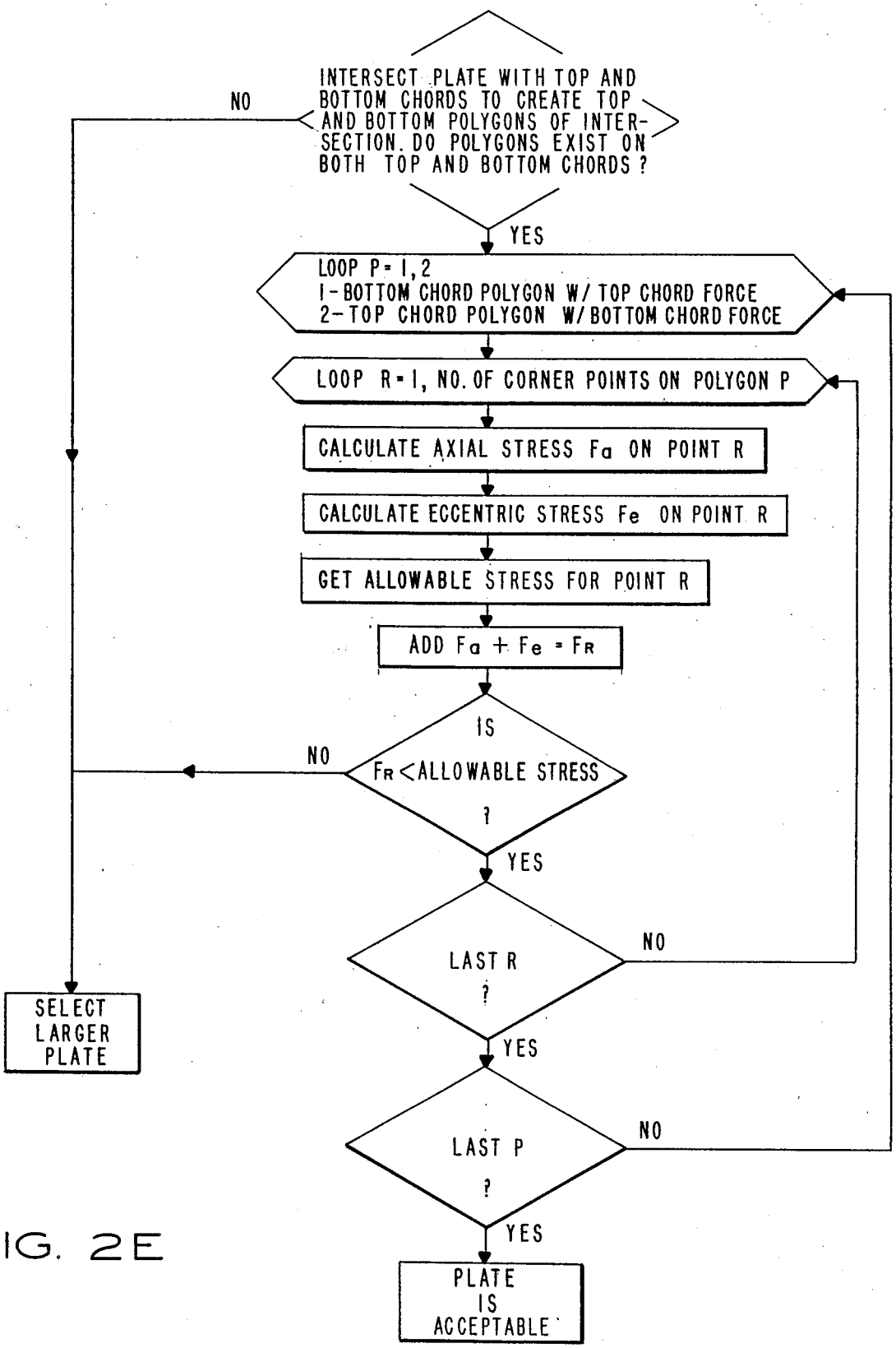
Figure 9A:
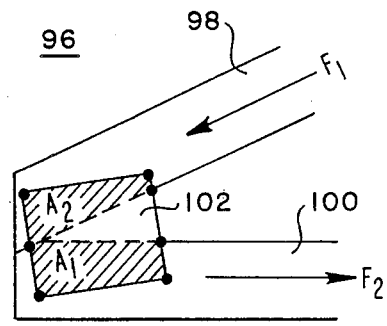
FIGS. 9A and 9B illustrate the determination of the eccentricity forces acting on the top and bottom chords of the truss at a heel joint.
Figure 9B:
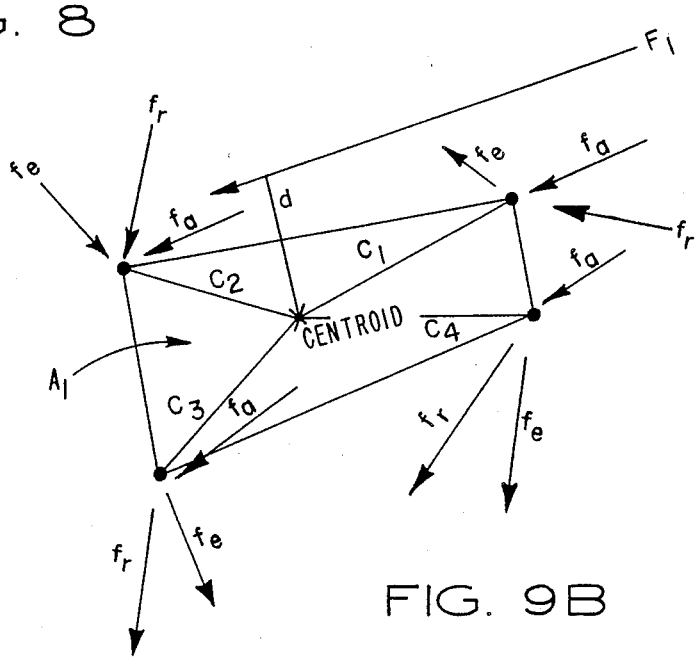

Once the boundary conditions, the area overlap and the shear, tension and combined shear-tension parameters are satisfied for a particular plate, the plate is usually acceptable. However, in some instances, such as at heel joints, an additional check is performed because of the eccentric moment or torque acting on the joint. Referring to FIGS. 2E, 9A and 9B a heel joint 96 is depicted at which top chord 98 and bottom chord 100 intersect at an acute angle. The force F1 acting in top chord 98 causes an eccentric or off-center moment to be imparted to bottom chord 100. Similarly, the force F2 acting in bottom chord 100 imparts an eccentric or off-center torque to top chord 98. These eccentric forces also impart a twisting action on connector plate 102, thereby tending to dislodge plate 102 from the joint.

To perform the eccentricity check, first and second intersection polygons A1 and A2 are determined by intersecting the rectangle representing connector plate 102 with bottom and top chords 100 and 98, respectively, in substantially the same manner as described above. If an intersection polygon does not exist on either top chord 98 or bottom chord 100, the particular plate is discarded in favor of the next larger plate until both polygons A1 and A2 are defined. The centroid (geometric center), moment of inertia and the polar moment of inertia of each intersection polygon A1 and A2 are determined using Hankinson's equations, as set forth in HP67/HP97, Civil Engineering Pac. 1, Rev. B, April 1987 (Hewlett-Packard Manual 00097-90147), page 02—02, which is hereby incorporated by reference herein.

FIG. 9B illustrates the forces acting on intersection polygon A1 by virtue of Force F1 acting in top chord 98. At each of the corner points of polygon A1, two stresses, an axial stress fa and an eccentric stress fe, are computed. Axial stress fa is equal to F1 divided by the area of polygon A1 and is the same magnitude at each of the corner points. The eccentric stress fe is determined from the following equation:

$$fe = (M \times c)/Ip$$

where

M is the moment caused by F1 (M equals $F1 \times d$);

d is the distance from the line along which the force F1 acts to the centroid of polygon A1;

c is the distance from the centroid of polygon A1 to the corner point on A1 where fe is being calculated (C1, C2, C3 and C4 for the respective first, second third and fourth corner points; and Ip is the polar moment of inertia of polygon A1.

After the axial and eccentric stresses are determined at each corner point, the stresses are summed by vector addition to find the resultant stress fr at each corner point. The resultant stress fr acting at a corner point is compared to a maximum allowable resultant stress. If the resultant stress exceeds the maximum allowable resultant stress at any corner point, the eccentricity parameter is not satisfied and the plate must be discarded. If the resultant stress at each corner point is less than or equal to the maximum allowable resultant stress, the eccentricity parameter is satisfied for intersection polygon A1 and intersection A2 is then checked to determine the eccentricity stresses in polygon A2 resulting from force F2 acting in bottom chord 100. The eccentricity parameters must be satisfied for both intersection polygons A1 and A2 for the connector plate to be acceptable.

When all of the applicable parameters described above are satisfied for a particular plate, the plate information, including the identification of the plate and the position thereof on the joint, is stored in the system memory. The program then moves to the next joint in sequence and the aforementioned procedure and checks are repeated with respect to the next joint. When all of the truss joints have been properly plated, the task is completed and the truss can be assembled according to specifications.

Figure 10:
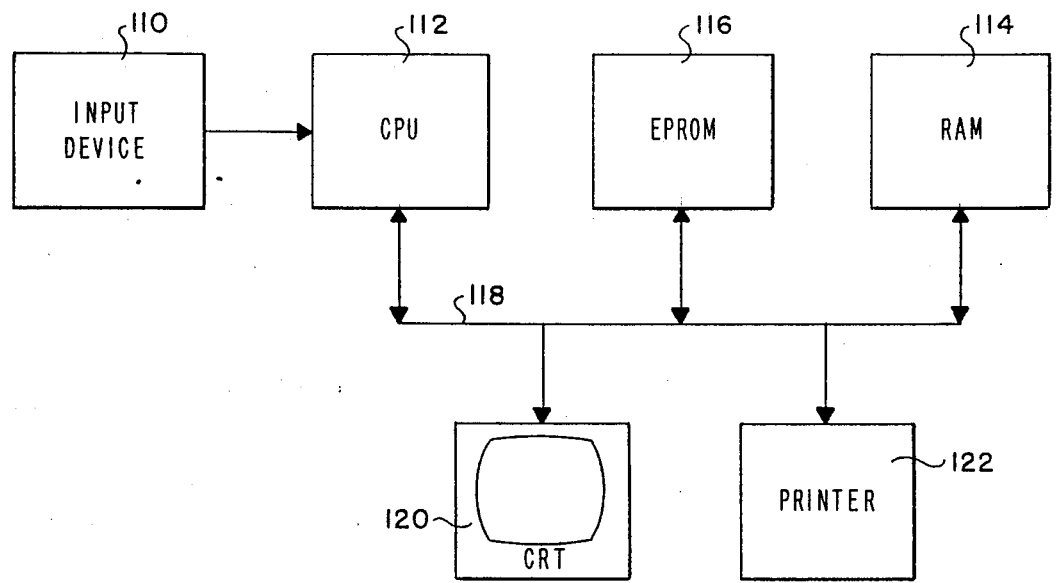
FIG. 10 is a block diagram of a computer system for executing the preferred embodiment of the method for selecting and positioning a connector plate at a corresponding truss joint in accordance with the present invention.

Referring to FIG. 10, the plate selection/placement program routine described above is preferably implemented in connection with a digital computer system, such as a personal computer having a DOS-based operating system. Truss profile information, including the span of the truss, the truss pitch and the respective positions of the web members connecting the top and bottom truss chords to define the respective truss joints, are entered by a user via an input device 110, such as a keyboard, into a central processing unit (CPU) 112. CPU 112 loads the input data into a random access memory (RAM) 114. A storage device, such as an erasable programmable read only memory (EPROM) 116, is provided for storing the plate selection/placement program. One skilled in the art will appreciate that the program could be stored on other media, such as on a hard disk or on magnetic tape, in lieu of EPROM 116. The program contains instructions for controlling CPU 112 to perform the various routines described above. EPROM 116 has a permanent data base stored therein, which defines the corresponding reference parameters for each truss joint and selected characteristics of the connector plates to be tested.

CPU 112 communicates with RAM 114 and EPROM 116 via a data bus 118. To initialize the program, CPU 112 will address EPROM 116, whereupon the program instructions will be executed to control CPU 112. In response to the program instructions, CPU 112 will establish the boundary vectors corresponding to the truss profile information entered by the user and will execute the program steps described above. A standard graphics program may be provided for displaying the truss joint with the connector plate superimposed thereon on an electronic display, such as a cathode ray tube (CRT) display 120. A printer 122 can also be provided for a hard copy printout.

Various embodiments of the invention have now been described in detail. Since it is obvious that many additions and changes in and additions to the abovedescribed preferred embodiment may be made without departing from the nature, spirit and scope of the invention, the invention is not to be limited to said details, except as set forth in the appended claims.

What is claimed is:

1. A method of positioning a connector plate at a corresponding joint between a plurality of wood members of a wood truss, said method comprising the steps of:

defining a predetermined reference point on the joint;

representing each wood member as a corresponding two-dimensional polygon, each side of which is defined by a corresponding member vector, each of said member vectors having starting and ending points relative to the reference point;

selecting a particular member vector as a boundary vector to define a joint boundary;

representing the connector plate as a rectangle of predetermined dimensions, each side of said rectangle being defined by a corresponding one of a plurality of plate vectors, each of said plate vectors having starting and ending points relative to the reference point; and positioning the rectangle so that one of the plate vectors intersect a boundary vector.

2. The method according to claim 1 wherein the step of positioning the rectangle includes initially positioning the rectangle so that a geometric center thereof coincides with the reference point, determining whether any of the plate vectors intersects the boundary vector, and if any of the plate vectors intersects the boundary vector, repositioning the rectangle to move it within the boundary vector.

3. The method according to claim 1 wherein the step of defining the reference point includes establishing a Cartesian coordinate system having an origin corresponding to the reference point, the respective starting and ending points of each of the member vectors and each of the plate vectors being expressed in Cartesian coordinates relative to the reference point.

4. The method according to claim 3 wherein the step of positioning the rectangle is comprised of the following sub-steps:

selecting a particular boundary vector and determining which, if any, of the plate vectors intersects the particular boundary vector;

if any of the plate vectors intersects the particular boundary vector, selecting a particular plate vector which intersects the particular boundary vector and determining the Cartesian coordinates of the point of intersection of the particular plate vector with a particular boundary vector and the Cartesian coordinates of a distal point on the particular plate vector which extends the farthest beyond the particular boundary vector;

moving the rectangle a first predetermined distance corresponding to a difference between respective first coordinates of said intersection point and said distal point along the corresponding first axis of the coordinate system and a second predetermined distance corresponding to a difference between respective second coordinates of said intersection point and said distal point along a corresponding second axis of the coordinate system, which is perpendicular to the first axis, so that the particular plate vector does not intersect a particular boundary vector;

if necessary, repeating the preceding sub-steps with respect to each plate vector which intersects the particular boundary vector so that the rectangle is completely within the boundary represented by the particular boundary vector; and repeating the preceding sub-steps with respect to each boundary vector.

5. The method according to claim 4 wherein the sub-steps of claim 4 are iteratively repeated until either none of the plate vectors intersects any of the boundary vectors or until it is determined that the plate cannot be properly positioned within the predetermined joint boundary, whichever condition occurs first.

6. The method according to claim 1, wherein the respective directions of said member vectors define a counterclockwise rotation around the corresponding polygons and the respective directions of said plate vectors define a counterclockwise rotation around the rectangle.

7. In a data processing system, an apparatus for positioning a connector plate at a corresponding joint between a plurality of wood members of a wood truss, said apparatus comprising:

data processing means;

input means coupled to said processing means for entering selected truss parameters into the system;

memory means coupled to said processing means for storing said selected truss parameters, said memory means having a predetermined set of program instructions stored therein;

said data processing means being responsive to said truss parameters for determining the position of the connector plate at the joint according to said program instructions by the following steps:

defining a predetermined reference point on the joint;

representing each wood member as a corresponding two-dimensional polygon, each side of which is defined by a corresponding member vector, each of said member vectors having starting and ending points relative to the reference point;

selecting a particular member vector as a boundary vector for each joint boundary;

representing the connector plate as a rectangle of predetermined dimensions, each side of said rectangle being defined by a corresponding one of a plurality of plate vectors, each of said plate vectors having starting and ending points relative to the reference point; and superimposing the rectangle on the joint so that none of the plate vectors intersect the boundary vector.

8. A method of determining respective areas of overlap of a connector plate on individual wood members of a corresponding truss joint, said method comprising:

defining a predetermined reference point on the joint;

representing each wood member as a corresponding two-dimensional polygon, each side of which is defined by a corresponding member vector, each of said member vectors having starting and ending points relative to the reference point;

representing the connector plate as a rectangle of predetermined dimensions, each side of said rectangle being defined by a corresponding one of a plurality of plate vectors, each of said plate vectors as having starting and ending points relative to the reference point;

determining respective areas of intersection of the rectangle with the respective polygons represented by the wood members, said areas of intersection representing the respective areas of overlap of the connector plate on the respective wood members.

9. The method according to claim 8 wherein the step of defining the reference point includes establishing a Cartesian coordinate system having an origin corresponding to the reference point, the starting and ending points of each of the member vectors and each of the plate vectors being expressed in Cartesian coordinates relative to the reference point.

10. The method according to claim 9 wherein said step of determining the respective areas of intersection is comprised of the following sub-steps for each area of intersection:
defining each area of intersection as a corresponding intersection polygon having a determined number of corner points;
determining the Cartesian coordinates of each of the corner points; and
determining the area of the intersection polygon by solving the following equation:

$$\text{Area} = \sum_{i=1}^{n} (Yi + 1 - Yi)(Xi + 1 + Xi)/2$$

where n is the number of corner points and Xi, Yi are the Cartesian coordinates of an ith corner point.

11. The method according to claim 8 further including the step of comparing the area of overlap of the plate determined for each wood member with a predetermined minimum area of overlap for the corresponding wood member to determine whether the connector plate meets applicable criteria for the corresponding wood member.

12. In a data processing system, an apparatus for determining respective areas of overlap of a connector plate on individual wood members of a corresponding truss joint, said apparatus comprising:
data processing means;
input means coupled to said processing means for entering selected truss parameters into the system;
memory means coupled to said processing means for storing said selected truss parameters, said memory means having a predetermined set of program instructions stored therein; and
said data processing means being responsive to said truss parameters for determining the respective areas of overlap of the plate on the respective wood members according to said program instructions by the following steps:
defining a predetermined reference point on the joint;
representing each wood member as a corresponding two-dimensional polygon, each side of which is defined by a corresponding member vector, each of said member vectors having starting and ending points relative to the reference point;
representing the connector plate as a rectangle of predetermined dimensions, each side of said rectangle being defined by a corresponding one of a plurality of plate vectors, each of said plate vectors having starting and ending points relative to the reference point; and
determining respective areas of intersection of the rectangle with the respective polygons represented by the wood members, said areas of intersection representing the respective areas of overlap of the connector plate on the respective wood members.

13. The apparatus according to claim 12 wherein said selected truss parameters include a predetermined minimum area of overlap for each wood member, said processing means for comparing the determined area of overlap of the plate on each wood member with the predetermined minimum area of overlap for the corresponding wood member, to determine whether the connector plate meets applicable criteria for the corresponding wood member.

14. A method of determining eccentric forces acting on a truss joint at which a top chord of a truss intersects a bottom chord thereof and is secured to the bottom chord by a connector plate, comprising the steps of:
defining a first two-dimensional polygon representing an area of overlap of the connector plate on the top chord and a second two-dimensional polygon representing an area of overlap of the connector plate on the bottom chord;
selecting a first corner point on the first polygon and computing respective magnitudes and directions of axial and eccentric stresses acting at said first corner point;
summing the respective magnitudes and directions of the axial and eccentric stresses to compute a magnitude and direction of a resultant stress on the first corner point;
comparing the computed resultant stress with a predetermined allowable stress; and
if the computed resultant stress is less than the predetermined allowable stress at the first corner point, repeating the preceding steps for each of the other corner points of the first polygon until either the computed resultant stress at each corner point of the first polygon is less than a corresponding allowable stress or until the computed resultant stress at a corner point is determined to be greater than a corresponding allowable stress, whichever condition occurs first.

15. The method according to claim 14 further including the step of repeating the steps of claim 14 with respect to the second polygon if the resultant stress on each of the corner points of the first polygon is less than the corresponding allowable stress.

16. The method according to claim 15 wherein the step of defining the first and second polygons is comprised of the following sub-steps:
establishing a Cartesian coordinate system having an origin corresponding to a predetermined reference point on the joint;
representing the top and bottom chords as respective first and second two-dimensional polygons, each side of each polygon being defined by a corresponding member vector, each of said member vectors having starting and ending points expressed in Cartesian coordinates relative to the reference point to define a predetermined direction around the corresponding polygon;
representing the connector plate as a rectangle of predetermined dimensions, each side of said rectangle being defined by a corresponding one of a plurality of plate vectors, each of said plate vectors having starting and ending points expressed in Cartesian coordinates relative to the reference point to define a predetermined direction around the rectangle; and
determining respective areas of intersection of the rectangle with the first and second polygons, said areas of intersection defining respective first and second intersection polygons.

17. In a data processing system, an apparatus for determining eccentric forces acting on a truss joint at which a top chord of a truss intersects a bottom chord thereof and is secured to the bottom chord by a connector plate, said apparatus comprising:

data processing means;

input means coupled to said processing means for entering a selected truss into the system, said selected truss parameters including a predetermined allowable stress on the joint;

memory means coupled to said processing means for storing said selected truss parameters, said memory means having a predetermined set of program instructions stored therein; and said data processing means being responsive to said selected truss parameters for determining whether the connector plate meets applicable criteria for the joint according to said program instructions by the following steps:

defining a first two-dimensional polygon representing an area of overlap of the connector plate on the top chord and a second twodimensional polygon representing an area of overlap of the connector plate on the bottom chord;

determining respective magnitudes and directions of axial and eccentric stresses acting at each corner point of the first and second polygons;

summing the respective magnitudes and directions of the axial and eccentric forces to compute magnitude and direction of a resultant stress acting at each corner point; and comparing the computed resultant stress at each corner point with the predetermined allowable stress to determine whether the plate meets the applicable criteria for the joint.

* * * * *